(12) United States Patent
Picciotto et al.

(10) Patent No.: US 7,289,868 B2
(45) Date of Patent: Oct. 30, 2007

(54) SYSTEM AND METHOD FOR CALCULATING A SHIFT VALUE BETWEEN PATTERN INSTANCES

(75) Inventors: Carl E. Picciotto, Menlo Park, CA (US); Jun Gao, Mountain View, CA (US); Ronald A. Hellekson, Eugene, OR (US); Judson M. Leiser, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 130 days.

(21) Appl. No.: 11/209,134

(22) Filed: Aug. 22, 2005

(65) Prior Publication Data

US 2007/0043465 A1   Feb. 22, 2007

(51) Int. Cl.
*G06F 19/00* (2006.01)
(52) U.S. Cl. .................. 700/121; 700/57; 700/192; 438/401; 438/975
(58) Field of Classification Search ............... 700/57, 700/121, 192; 438/401, 975
See application file for complete search history.

(56) References Cited

U.S. PATENT DOCUMENTS 4,780,617 A * 10/1988 Umatate et al. ............ 250/548
5,149,980 A    9/1992  Ertel et al.
5,204,739 A    4/1993  Domenicali
5,459,578 A   10/1995  Park et al.
6,118,132 A    9/2000  Tullis
6,195,475 B1   2/2001  Beausoleil, Jr. et al.
6,333,786 B1 * 12/2001  Uzawa et al. ............... 356/401
6,720,117 B2 *  4/2004  Matsumoto et al. ........... 430/5
6,721,667 B2    4/2004  Banes et al.
6,770,899 B2    8/2004  Hasegawa et al.
6,777,084 B2    8/2004  Nagaoka
6,973,397 B2 * 12/2005  Haginiwa .................... 702/83
7,054,007 B2 *  5/2006  Leroux et al. .............. 356/401
2004/0092080 A1 * 5/2004  Chen ......................... 438/401

* cited by examiner

*Primary Examiner*—Leo Picard
*Assistant Examiner*—Alexander Kosowski (57) ABSTRACT

A method comprising adjusting a first relative position between a substrate and a fabrication unit by a first shift value, forming a first pattern relative to a first pattern instance on the substrate subsequent to adjusting the first relative position by the first shift value, and calculating a second shift value using a first displacement between the first pattern and the first pattern instance and a second displacement between a second relative position of the first pattern instance with respect to a second pattern instance is provided.

30 Claims, 7 Drawing Sheets

EXPANDED VIEW

SYSTEM AND METHOD FOR CALCULATING A SHIFT VALUE BETWEEN PATTERN INSTANCES

BACKGROUND

Various systems exist for the purpose of positioning a substrate in one or more locations to allow patterns to be formed on the substrate. Some systems, such as alignment systems, attempt to position substrates by directly aligning one or more patterns on the substrates with the goal of a zero-length displacement. Moiré patterns or other particular patterns such as a box and a cross may be used for this purpose.

With existing alignment systems, the positioning of substrates may be poorly quantized and may not be useful in instances where a non-zero displacement is desired. In addition, the overlay of components of a fabrication system such a mask or a mold may not be possible. It would be desirable to be able to accurately quantize the position or positions of substrates.

SUMMARY

One form of the present invention provides a method comprising adjusting a first relative position between a substrate and a fabrication unit by a first shift value, forming a first pattern relative to a first pattern instance on the substrate subsequent to adjusting the first relative position by the first shift value, and calculating a second shift value using a first displacement between the first pattern and the first pattern instance and a second displacement between a second relative position of the first pattern instance with respect to a second pattern instance.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

According to one or more embodiments, the systems and methods described herein provide a process by which a displacement sensing system may be used to provide overlay alignment metrology for fabrication processes involving repeating patterns. The repeating patterns may be duplicate device patterns distributed across a substrate (e.g., within multiple dice across a silicon wafer), or the repeating patterns may be inherent to a single, large, regular substrate such as a multi-pixel display. The fabrication process may be any step and repeat method, such as those involving photolithography (contact and non-contact), imprint lithography, laser direct-writing or lithography, e-beam direct-writing or lithography, x-ray lithography, or printing, such as via a thermal inkjet technology or piezoelectric inkjet technology or other types of non-impact printing. The fabrication process describes a multi-field process, involving individual identical pattern fields or regions which are smaller than the overall substrate.

According to one or more embodiments, a system and method for forming patterns on a substrate with repeating pattern instances are provided. The system and method include capturing reference information associated with a pattern instance on a substrate, positioning a fabrication unit relative to the pattern instance, and forming a pattern associated with the pattern instance using the fabrication unit. The system and method further include determining a displacement of the formed pattern relative to the pattern instance and determining a displacement of the pattern instance relative to a next pattern instance. Using the displacements, the system and method calculate a next shift amount and cause the fabrication unit to be positioned relative to the next pattern instance using the next shift amount. By doing so, the system and method align the fabrication unit relative to the next pattern instance such that a pattern associated with the next pattern instance may be formed in a desired position relative to the next pattern instance.

The repeating patterns include identical or substantially identical pattern instances that were previously formed on the substrate. Using the systems and methods described herein, a fabrication unit may be closely positioned to form patterns relative to the identical or substantially identical pattern instances. In one embodiment, the pattern instances are included in a first layer on the substrate and the patterns formed relative to the pattern instances are included in a second layer on the substrate.

Figure 1:
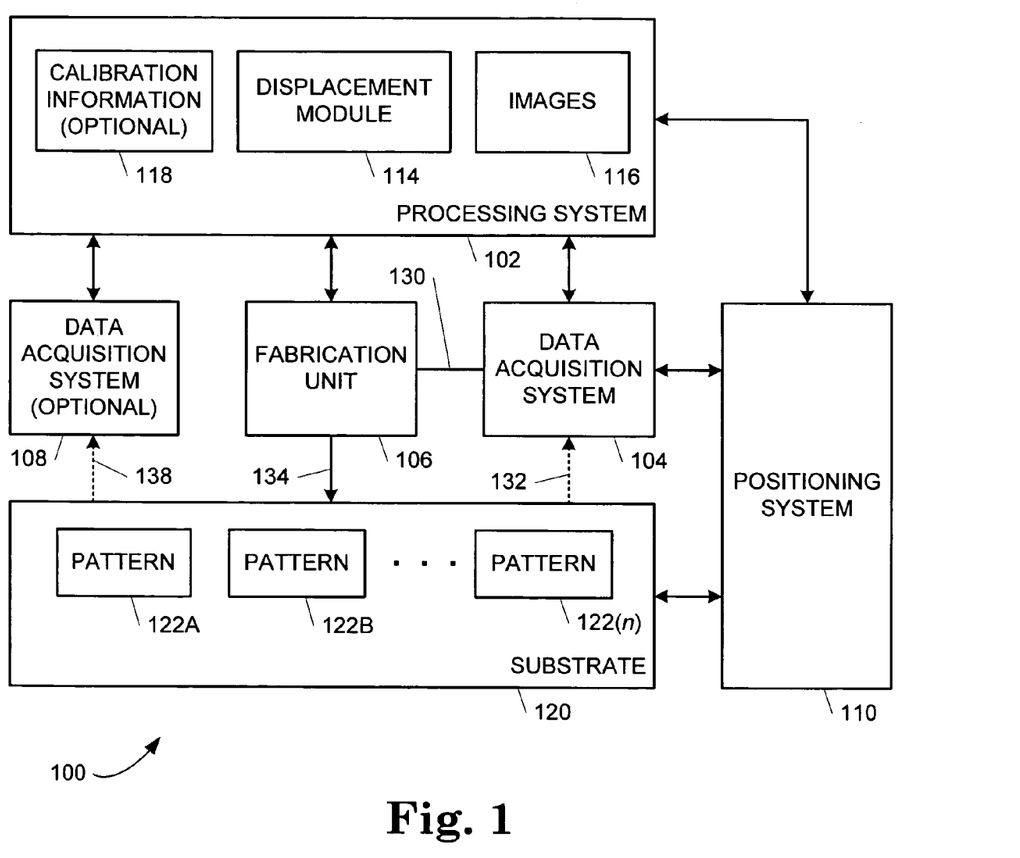
FIG. 1 is a block diagram illustrating one embodiment of a fabrication system.

FIG. 1 is a block diagram illustrating one embodiment of a fabrication system 100 with a processing system 102. Fabrication system 100 includes processing system 102, a data acquisition system 104, a fabrication unit 106, an optional data acquisition system 108, and a positioning system 110. Fabrication system 100 operates on a substrate 120 that includes pattern instances 122A through 122(n) (referred to individually as pattern instance 122 or collectively as pattern instances 122) where n is greater than one and represents the nth pattern instance. Pattern instances 122 are identical or substantially identical.

Processing system 102 receives and stores images 116 from data acquisition system 104 and optionally receives and stores calibration information 118 from optional data acquisition system 108. Processing system 102 processes images 116 and calibration information 118 using a displacement module 114. Using displacement module 114, processing system 102 identifies or locates pattern instances 122 in images 116, and calculates displacements between different pattern instances 122 in different images 116. Processing system 102 may calculate the displacements to a pixel or a sub-pixel resolution. Processing system 102 also determines displacements of formed patterns (not shown in FIG. 1) relative to pattern instances 122 using images 116 alone, images 116 and calibration information 118 combined, or calibration information 118 alone.

Displacement module 114 may embody any suitable algorithm for calculating displacements using images 116, calibration information 118, or a combination of images 116 and calibration information 118. Suitable algorithms may include an image cross-correlation algorithm, a phase delay detection algorithm, or other displacement estimation algorithms.

With an image cross-correlation algorithm, displacement module 114 uses image cross-correlations to calculate the displacement. One example of an image cross-correlation algorithm is an N-cubed algorithm. The N-cubed algorithm analyzes image cross-correlations to determine displacements b directly locating a peak of a correlation surface to the nearest pixel, or by curve-fitting the correlation surface to a function (e.g., a simple second-order Taylor Series expansion function) and then determining the location of the maximum (or minimum) value to sub-pixel precision. The correlation function used in the N-cubed algorithm is defined by Equation I.

$$C_{i,j}^k = \sum_{m=1}^{M} \sum_{n=1}^{N} |r_{m,n} - c_{m-i,n-j}|^k \quad \text{Equation I}$$

In Equation I, $C_{i,j}^k$ is the correlation surface, $r_{m,n}$ and $c_{m,n}$ represent the two image frames (e.g., reference and comparison frames), and k is an exponent that is typically two. The correlation surface is fit to a curve, and the extremum of this curve (for the case of this correlation function, it is a global minimum point) is deduced, thereby determining the displacement vector to sub-pixel precision. Any function that results in an extremum at the point of closest image matching could be incorporated into such as scheme.

Another example of an image cross-correlation algorithm is a nearest neighbor navigation algorithm. With the nearest neighbor navigation algorithm, displacement module 114 uses image cross-correlations or comparison functions which approximate or parallel pixel-by-pixel correlation functions to calculate the displacement. The nearest neighbor navigation algorithm uses very short correlation distances in calculating the displacement. Additional details of nearest neighbor navigation algorithms may be found in U.S. Pat. No. 5,149,980 entitled "SUBSTRATE ADVANCE MEASUREMENT SYSTEM USING CROSS-CORRELATION OF LIGHT SENSOR ARRAY SIGNALS" listing Ertel et al. as inventors and U.S. Pat. No. 6,195,475 entitled "NAVIGATION SYSTEM FOR HANDHELD SCANNER" listing Beausoleil et al. as inventors. Each of these patents is assigned to the assignee of the present invention, and is hereby incorporated by reference herein.

With the phase delay detection algorithm (and other similar phase correlation methods) displacement module 114 processes images converted to a frequency domain representation and draws equivalences between phase delays and displacements to calculate the displacement.

Functions performed by processing system 102 and displacement module 114 may be implemented in hardware, software, firmware, or any combination thereof. The implementation may be via a microprocessor, programmable logic device, or state machine. Components of the present invention, e.g., displacement module 114, may reside in software on one or more computer-readable mediums. The term computer-readable medium as used herein is defined to include any kind of memory, volatile or non-volatile, such as floppy disks, hard disks, CD-ROMs, flash memory, read-only memory (ROM), and random access memory.

Data acquisition system 104 includes any suitable optical or non-optical system configured to acquire data from substrate 120 to form one or more images 116 such that images 116 may be used to identify locations of pattern instances 122. Data acquisition system 104 is configured in a fixed location relative to fabrication unit 106 as indicated by an arrow 130. Examples of optical systems include a camera or other device configured to optically capture images 116. Examples of non-optical systems include electron beam devices or other devices configured to capture images 116 using non-optical means. Data acquisition system 104 has a resolution and a scale appropriate for the type of substrate 120. The resolution may be pixel, sub-pixel, or another suitable resolution, and the scale may be nanoscale or another suitable resolution. Images 116 include any set of optical or non-optical data that may be used to identify the locations of pattern instances 122.

In operation, data acquisition system 104 captures images 116 of substrate 120 such that each image 116 includes at least one pattern instance 122 as indicated by a dashed arrow 132 and provides images 116 to processing system 102.

Fabrication unit 106 includes any suitable patterning or imaging device that is configured to form patterns (not shown in FIG. 1) on substrate 120 relative to pattern instances 122 as indicated by an arrow 134. The patterns may be formed in a next layer relative to a layer that includes pattern instances 122. Fabrication unit 106 may include a photolithography unit (contact and non-contact), an imprint lithography unit, a laser direct-writing or lithography unit, an e-beam direct-writing or lithography unit, an x-ray lithography unit, or a printing unit, such as a thermal inkjet printer unit, a piezoelectric inkjet printer unit, or another type of non-impact printing unit, for example. Fabrication unit 106 is configured in a fixed location relative to data acquisition system 104 as indicated by arrow 130. Accordingly, fabrication unit 106 and data acquisition system 104 move in unison relative to substrate 120.

Optional data acquisition system 108 includes any suitable optical or non-optical system configured to acquire data from substrate 120 to form calibration information 118 such that calibration information 118 may be used to identify locations of patterns formed by fabrication unit 106 relative to pattern instances 122. Examples of optical systems include a camera or other device configured to optically capture calibration information 118. With optical systems, calibration information 118 may comprise one or more images. Examples of non-optical systems include electron beam devices, an atomic force microscope (AFM), or other devices configured to capture calibration information 118 using non-optical means. With non-optical systems, calibration information 118 may include direct displacement measurements (e.g., from an AFM), capacitance measurements or information that represents the interaction between grating patterns (via Moiré or diffraction effects) across the multiple layers. Optional data acquisition system 108 has a resolution and a scale appropriate for the type of substrate 120. The resolution may be pixel, sub-pixel, or another suitable resolution, and the scale may be nanoscale or another suitable resolution. Calibration information 118 may include any set of optical or non-optical data that may be used to identify formed patterns relative to pattern instances 122 or the displacement of formed patterns relative to pattern instances 122.

In operation, optional data acquisition system 108 captures calibration information 118 of substrate 120 such that each calibration information 118 either includes an image with at least one formed pattern and at least one pattern instance 122 as indicated by a dashed arrow 138 or a measured displacement between at least one formed pattern relative to at least one pattern instance 122. Optional data acquisition system 108 provides calibration information 118 to processing system 102. The functions of optional data acquisition system 108 may be performed by data acquisition system 104 in one or more of the embodiments described herein.

Positioning system 110 is configured to position substrate 120 relative to data acquisition system 104, fabrication unit 106, and optional data acquisition system 108 according to values calculated by processing system 102. In one embodiment, position system 110 moves or otherwise adjusts the position of substrate 120 relative to data acquisition system 104, fabrication unit 106, and optional data acquisition system 108 according to next shift values calculated by processing system 102. In another embodiment, positioning system 110 moves or otherwise adjusts the position of data acquisition system 104, fabrication unit 106, and optional data acquisition system 108 relative to substrate 120 according to next shift values calculated by processing system 102.

In one embodiment, positioning system 110 operates in a closed loop structure where one or more devices provide positioning feedback. The devices may include optical encoders, laser inferometers, or image displacement systems, for example. In other embodiments, positioning system 110 includes a coarse adjustment system with a precision feedback system. In further embodiments, positioning system 110 includes a high-precision drive (not shown) and operates in an open loop configuration.

Substrate 120 may be any suitable one, two, or three dimensional work object such as a silicon or other type of semiconductor wafer, paper, a display panel, and a web of material. The term "web of material" covers both a web of material that carries objects (e.g., a conveyor) and the surface of a work object that is moveable relative to fabrication system 100. Each pattern instance 122 comprises any feature or set of features that is formed on substrate 120. Pattern instances 122 are sufficiently identical to allow consistent displacement calculations. Pattern instances 122 may be regularly or irregularly formed on substrate 120. For example, pattern instances 122 may be irregularly formed due to distortions or thermal drifting in the process of forming pattern instances 122.

Figure 2:
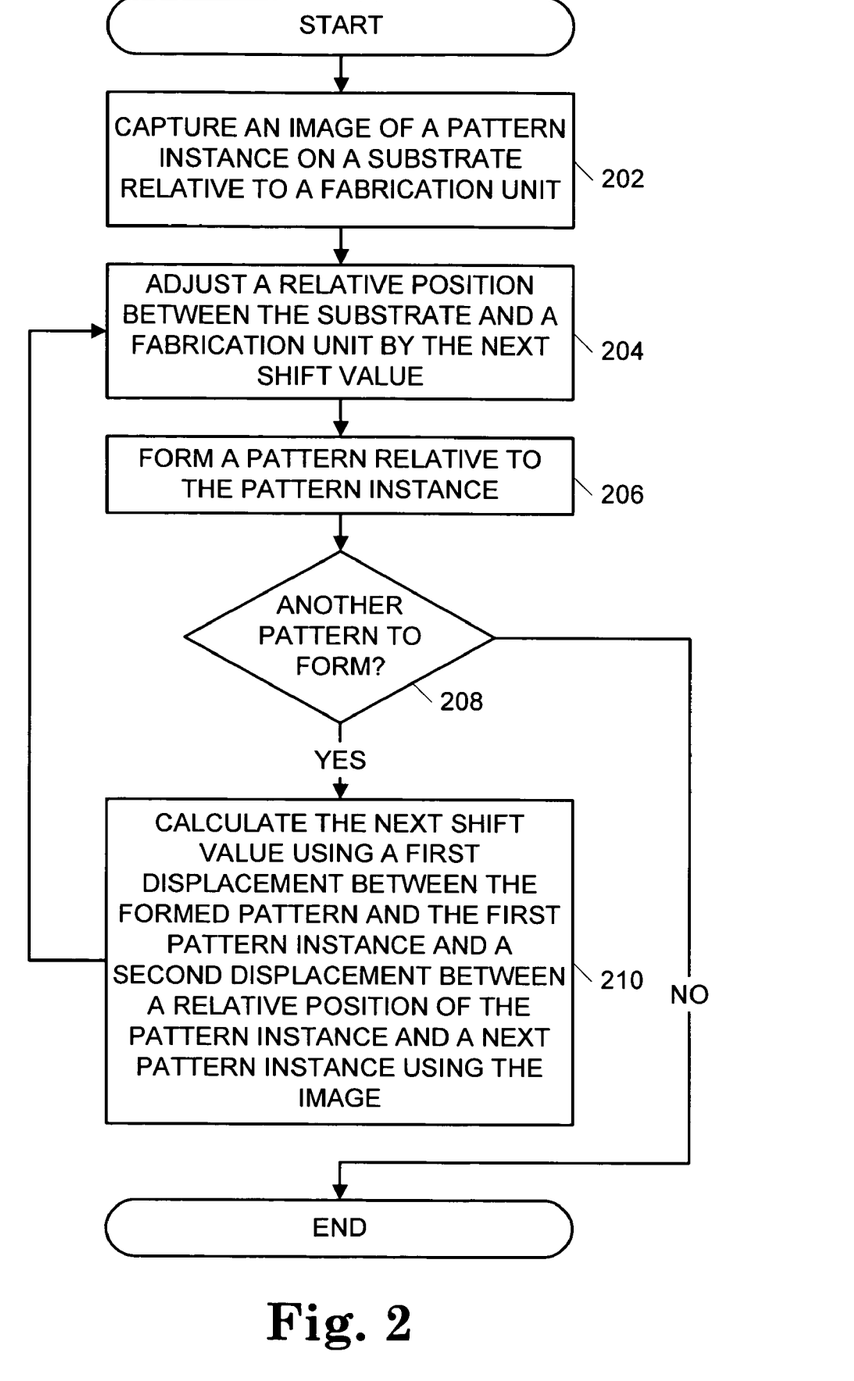
FIG. 2 is a flow chart illustrating one embodiment of a method for forming patterns on a substrate in a fabrication system.

FIG. 2 is a flow chart illustrating one embodiment of a method for forming patterns on substrate 120 in fabrication system 100 with processing system 102. The method of FIG. 2 will be described with reference to fabrication system 100 as shown in FIG. 1.

In FIG. 2, fabrication system 100 captures an image 116 of a pattern instance 122 on substrate 120 relative to fabrication unit 106 as indicated in a block 202. In one embodiment, data acquisition system 104 captures an image 116 that includes a pattern instance 122.

Fabrication system 100 adjusts a relative position between substrate 120 and fabrication unit 106 by a next shift value as indicated in a block 204. By adjusting the relative position between substrate 120 and fabrication unit 106, fabrication system 100 also adjusts the relative position between substrate 120 and data acquisition system 104 because of the fixed position between fabrication unit 106 and data acquisition system 104. In embodiments that include optional data acquisition system 108, fabrication system 100 may also adjust the relative position between substrate 120 and optional data acquisition system 108.

In one embodiment, positioning system 110 adjusts the relative position between substrate 120 and fabrication unit 106 by moving substrate 120 relative to data acquisition system 104, fabrication unit 106, and optional data acquisition system 108 by the next shift value. In other embodiments, positioning system 110 adjusts the relative position between substrate 120 and fabrication unit 106 by moving data acquisition system 104, fabrication unit 106, and optional data acquisition system 108 relative to substrate 120 by the next shift value.

In one embodiment, fabrication system 100 initially sets the next shift value to a nominal shift value that is based on the anticipated spacing between pattern instances 122. During subsequent shifts, the next shift value is calculated as described below with reference to a block 210. Accordingly, the function of block 204 is performed using these calculated next shift values in subsequent iterations of performing the functions of blocks 204 through 210.

Subsequent to the shift, fabrication system 100 forms a pattern relative to a pattern instance 122 as indicated in a block 206. As a result of adjusting the relative position in block 204, fabrication unit 106 is roughly aligned relative to the pattern instance 122 captured by the image 116 in performing the function of block 202. Accordingly, fabrication unit 106 forms the pattern relative to the pattern instance 122. Because the next shift value is an estimated (e.g., a nominal) value the first time the function of block 204 is performed, the first formed pattern may be offset from a desired position relative to the first pattern instance 122.

A determination is made by fabrication system 100 as to whether there is another pattern to form on substrate 120 as indicated in a block 208. If there is not another pattern to form on substrate 120, then the method ends as shown.

If there is another pattern to form on substrate 120, then fabrication system 100 calculates the next shift value using a first displacement between the formed pattern and the pattern instance 122 and a second displacement between a relative position of the pattern instance 122 with respect to a next pattern instance 122 using the image 116 as indicated in a block 210.

Fabrication system 100 determines the first displacement of the pattern formed in block 206 relative to corresponding pattern instance 122. Fabrication system 100 determines the first displacement using calibration information 118 from optional data acquisition system 108, an image 116 from data acquisition system 104, or the combination of calibration information 118 from optional data acquisition system 108 and an image 116 from data acquisition system 104.

In one embodiment, optional data acquisition system 108 is roughly aligned over the pattern instance 122 subsequent to the shift resulting from block 204 and captures calibration information 118 that includes the pattern formed in performing the function of block 206 and the pattern instance 122. In another embodiment, optional data acquisition system 108 includes an external device that is moved into position relative to the pattern instance 122 subsequent to the pattern being formed and the external device captures calibration information 118 that includes either the formed pattern and the pattern instance 122 or a measured displacement between the formed pattern and the pattern instance 122. In a further embodiment, data acquisition system 104 includes a field of view that includes the pattern instance 122 even after substrate 120 is shifted. In this embodiment, data acquisition system 104 captures an image 116 that includes the formed pattern and the pattern instance 122. In each of these embodiments, a component (not shown) such as a mask or a mold that is used by fabrication unit 106 may be moved to allow data acquisition system 106 or 108 to capture an unobstructed image of the pattern instance 122 with the formed pattern.

Depending on the embodiment, data acquisition system 104 or 108 provides image 116 or calibration information 118, respectively, to processing system 102. Processing system 102 receives image 116 or calibration information 118 and determines the first displacement between a desired position of the formed pattern and an actual position of the formed pattern relative to the pattern instance 122 using image 116 or calibration information 118. Processing system 102 determines the displacement using any suitable algorithm.

Fabrication system 100 also determines the second displacement between the pattern instance 122 and a next pattern instance 122. Subsequent to adjusting the relative position in block 204, a field of view of data acquisition system 104 includes a next pattern instance 122. Data acquisition system 104 captures an image 116 that includes the next pattern instance 122 and provides image 116 to processing system 102. Processing system 102 determines the second displacement between the next pattern instance 122 and the pattern instance 122 using images 116. Processing system 102 determines the displacement using any suitable algorithm.

Fabrication system 100 calculates the next shift value using the first and the second displacements. Processing system 102 calculates the next shift value by adding the first and second displacements to either the previous next shift value (e.g., in the embodiment of the method of FIG. 3) or the nominal shift value (e.g., in the embodiment of the method of FIG. 5). After the first iteration of performing the functions of blocks 204 through 208, the previous shift value is equal to the nominal shift value. In subsequent iterations of performing the functions of blocks 204 through 208, the previous shift value will be equal to the next shift value previously calculated by performing the function of block 210. In the embodiment described in additional detail below with reference to FIG. 5, processing system 102 calculates the next shift value by adding displacements to the nominal shift value in subsequent iterations.

The method returns to repeat the function of block 204 using the next shift value calculated in block 210 until there is not another pattern to form.

Figure 3:
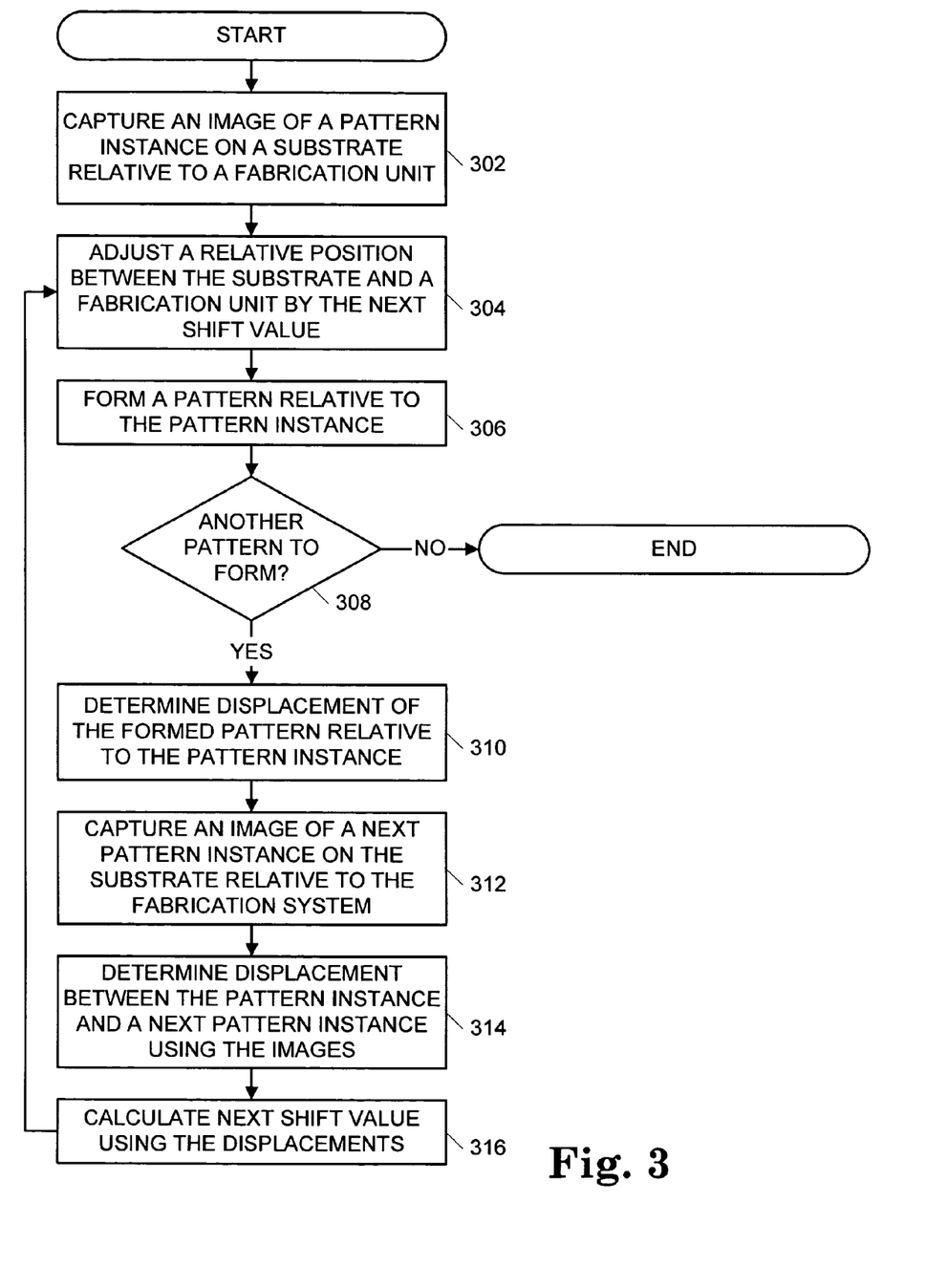
FIG. 3 is a flow chart illustrating another embodiment of a method for forming patterns on a substrate in a fabrication system.

FIG. 3 is a flow chart illustrating one embodiment of a method for forming patterns on substrate 120 in fabrication system 100 with processing system 102. The method of FIG. 3 will be described with reference to fabrication system 100 as shown in FIG. 1 and examples of pattern instances 122 and substrate 120 as shown in FIGS. 4A-4E according to one embodiment.

Figure 4A:
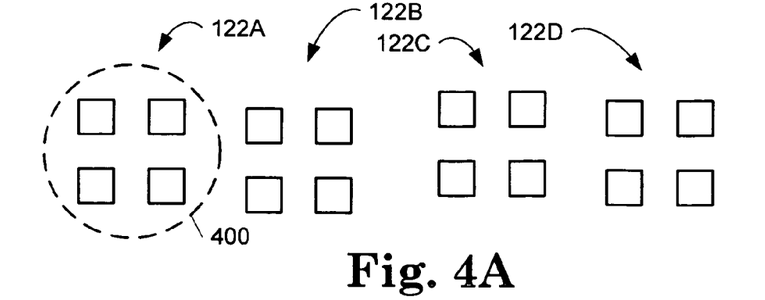
FIGS. 4A-4E are diagrams illustrating one embodiment of a method of forming patterns on a substrate.

Referring to FIG. 3 and FIG. 4A, data acquisition system 104 captures an image 116 that includes a region 400 with a pattern instance 122A on substrate 120 relative to fabrication unit 106 as indicated in a block 302.

Positioning system 110 adjusts a relative position between substrate 120 and fabrication unit 106 by a next shift value as indicated in a block 304. By adjusting the relative position between substrate 120 and fabrication unit 106, positioning system 110 also adjusts the relative position between substrate 120 and data acquisition system 104 because of the fixed position between fabrication unit 106 and data acquisition system 104. In embodiments that include optional data acquisition system 108, fabrication system 100 may also adjust the relative position between substrate 120 and optional data acquisition system 108.

In one embodiment, positioning system 110 adjusts the relative position between substrate 120 and fabrication unit 106 by moving substrate 120 relative to data acquisition system 104, fabrication unit 106, and optional data acquisition system 108 by the next shift value. In other embodiments, positioning system 110 adjusts the relative position between substrate 120 and fabrication unit 106 by moving data acquisition system 104, fabrication unit 106, and optional data acquisition system 108 relative to substrate 120 by the next shift value.

In one embodiment, fabrication system 100 initially sets the next shift value to a nominal shift value that is based on the anticipated spacing between pattern instances 122A and 122B. The nominal shift value is represented by an arrow 402 shown in FIG. 4B. During subsequent shifts, the next shift value is calculated as described below with reference to a block 316. Accordingly, the function of block 304 is performed using these calculated next shift values in subsequent iterations of performing the functions of blocks 304 through 316.

Figure 4B:
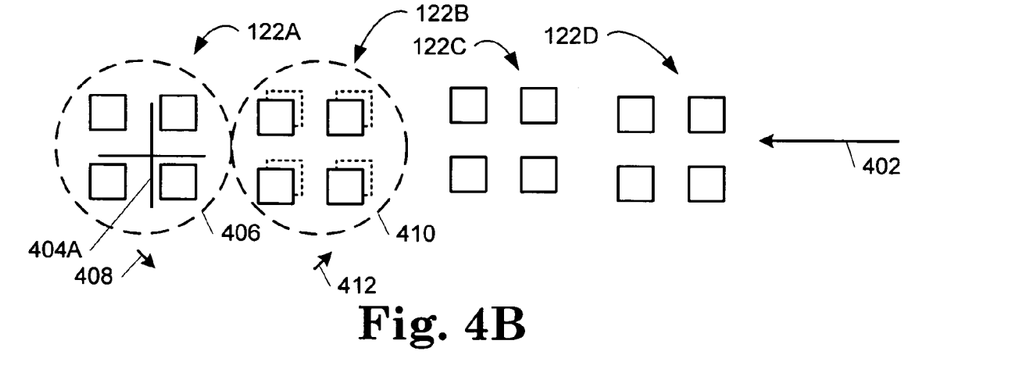

Subsequent to the shift, fabrication unit 106 forms a pattern relative to a pattern instance 122 as indicated in a block 306. As a result of the shift, fabrication unit 106 is roughly aligned relative to pattern instance 122A. In the example of FIG. 4B, fabrication unit 106 forms a pattern 404A relative to pattern instance 122A. Because the next shift value is an estimated (e.g., a nominal) value the first time the function of block 304 is performed, the first formed pattern 404A may be offset from a desired position relative to pattern instance 122A. For example, formed pattern 404A is shown in FIG. 4B as not centered relative to pattern instance 122A.

A determination is made by fabrication system 100 as to whether there is another pattern to form on substrate 120 as indicated in a block 308. If there is not another pattern to form on substrate 120, then the method ends as shown.

If there is another pattern to form on substrate 120, then processing system 102 determines a displacement of pattern 404A relative to corresponding pattern instance 122A as indicated in a block 310. More particularly, displacement module 114 determines a displacement of pattern 404A relative to pattern instance 122A using an image 116 or calibration information 118.

In one embodiment, optional data acquisition system 108 is roughly aligned over pattern instance 122A subsequent to adjusting the relative position in block 304 and captures calibration information 118 that includes a region 406 with formed pattern 404A and pattern instance 122A. In another embodiment, optional data acquisition system 108 includes an external device that is moved into position relative to pattern instance 122A subsequent to pattern 404A being formed and the external device captures calibration information 118 that includes either region 406 with formed pattern 404A and pattern instance 122A or a measured displacement between formed pattern 404A and the pattern instance 122A. In a further embodiment, data acquisition system 104 includes a field of view that includes region 406 and pattern instance 122A even after adjusting the relative position of substrate 120 and fabrication unit 106 in block 304. In this embodiment, data acquisition system 104 captures an image 116 that includes region 406 and pattern instance 122A. In each of these embodiments, a component (not shown) such as a mask or a mold that is used by fabrication unit 106 may be moved to allow optional data acquisition system 108 or 108 to capture an unobstructed image 116 or calibration information 118 of pattern instance 122A with formed pattern 404A.

Data acquisition system 104 or 108 provides image 116 or calibration information 118, respectively, to processing system 102. Processing system 102 receives image 116 or calibration information 118 and determines a displacement between a desired position of formed pattern 404A and an actual position of formed pattern 404A relative to pattern instance 122A as indicated by a displacement vector 408 shown in FIG. 4B using image 116 or calibration information 118. Processing system 102 determines the displacement using any suitable algorithm.

Data acquisition system 104 captures an image 116 of a next pattern instance 122 on substrate 120 relative to fabrication unit 106 as indicated in a block 312. As a result of adjusting the relative position in block 304, data acquisition system 104 is roughly aligned relative to pattern instance 122B in the example of FIG. 3B. Accordingly, data acquisition system 104 captures an image 116 that includes a region 410 with a next pattern instance 122B.

Processing system 102 determines a displacement between the current pattern instance 122 and a next pattern instance 122 as indicated in a block 314. Processing system 102 determines the displacement using any suitable algorithm.

In the example shown in FIGS. 4A and 4B, displacement module 114 determines a displacement vector 412 using a first image 116 that includes region 410 and pattern instance 122B and a second image 116 that includes region 400 and pattern instance 122A (captured as described with reference to block 302 above). In FIG. 4B, the dashed lines shown in region 410 represent pattern instance 122A in the second image 116 relative to pattern instance 122B in the first image 116.

Processing system 102 calculates a next shift value using the displacements determined in blocks 310 and 314 as indicated in a block 316. More particularly, displacement module 114 calculates the next shift value by adding the displacement vectors determined in blocks 310 and 314 to the previous next shift value. In the example of FIG. 3B, displacement vectors 408 and 412 are added to nominal shift vector 402 to generate displacement vector 422 as shown in FIG. 4C.

The method returns to repeat the function of block 304 using the next shift value calculated in block 316. The next iteration of performing the functions of blocks 304 through 316 will be described with reference to the example in FIGS. 4C and 4D according to one embodiment.

Figure 4C:
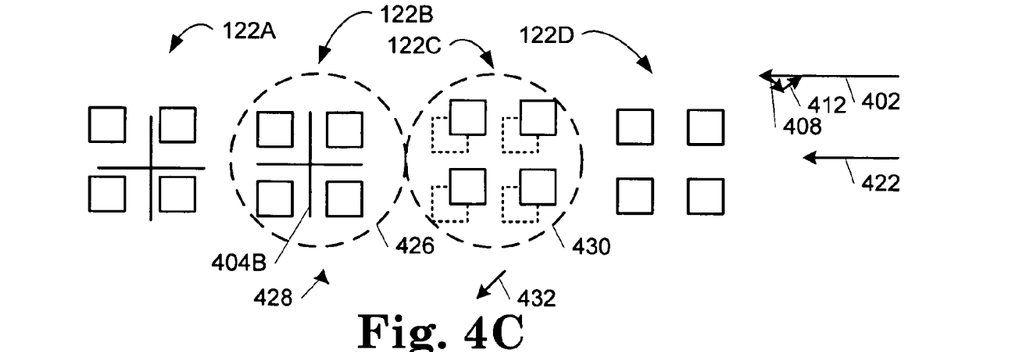

In the subsequent iteration, positioning system 110 adjusts the relative position of substrate 120 and fabrication unit 106 by the next shift value, which is shown as displacement vector 422 in FIG. 4C, as indicated by block 304. Fabrication unit 106 forms a pattern 404B relative to pattern instance 122B as indicated by block 306.

Assuming that there is another pattern to form, processing system 102 determines a displacement of formed pattern 404B relative to pattern instance 122B in a region 426 as indicated by a displacement vector 428 shown in FIG. 4C using image 116 or calibration information 118 as indicated in block 310 and described in additional detail above.

Assuming that pattern 404B is properly aligned relative to pattern instance 122B, displacement vector 428 may be zero or near zero.

In the example shown in FIG. 4C, data acquisition system 104 captures an image 116 that includes a region 430 with the next pattern instance 122C and provides image 116 to processing system 102 as indicated in block 312. Displacement module 114 determines displacement vector 432 using a first image 116 that includes region 430 and pattern instance 122C and a second image 116 that includes region 410 and pattern instance 122B (captured by performing the function of block 412 in the previous iteration). In FIG. 4C, the dashed lines shown in region 430 represent pattern instance 122B in the second image 116 relative to pattern instance 122C in the first image 116.

Figure 4D:
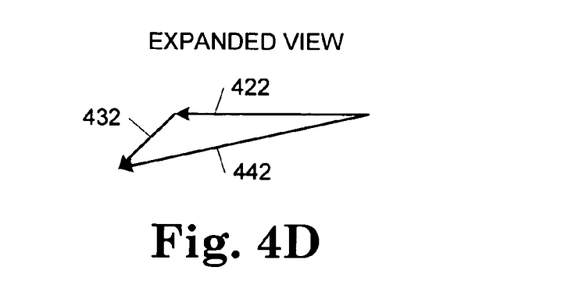

Processing system 102 calculates a next shift value using the displacements determined in blocks 310 and 314 as indicated in block 316. In the example shown in FIGS. 4C and 4D, processing system 102 calculates the next shift value by adding the displacement vectors determined in blocks 310 and 314 to the previous next shift value. For example, displacement vector 428, which is zero or near zero, and displacement vector 432 are added to the previous next shift vector 422 to generate displacement vector 442 as shown in FIG. 4D.

Figure 4E:
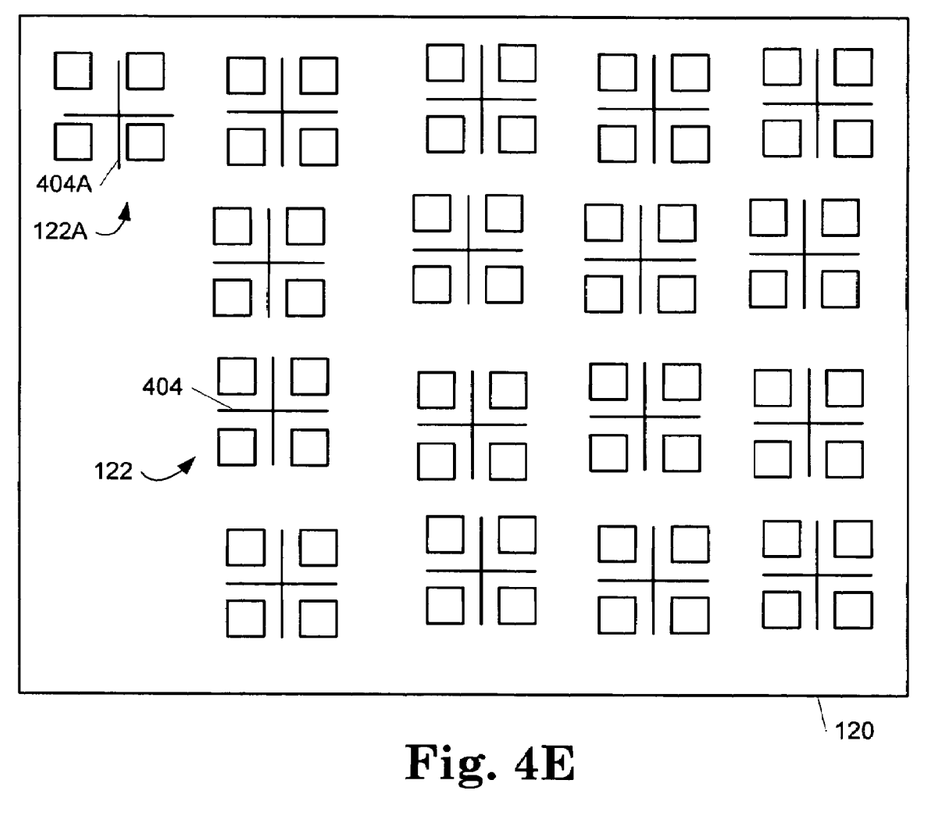

The method returns to repeat the function of block 304 using the next shift value calculated in block 316. The method continues performing the functions of blocks 304 through 316 until there are no additional patterns to form on substrate 120. FIG. 4E illustrates an example of substrate 120 where patterns 404 have been formed relative to each pattern instance 122. In the example of FIG. 4E, pattern instance 122A functions as an alignment calibration pattern. Accordingly, pattern 404A may be formed with a displacement relative to pattern instance 122A as shown. The displacement is determined by processing system 102 when the function of block 310 is first performed as described above.

In one embodiment, pattern instances 122 comprise a first layer on substrate 120 and patterns 404 comprise a second layer on substrate 120.

Figure 5:
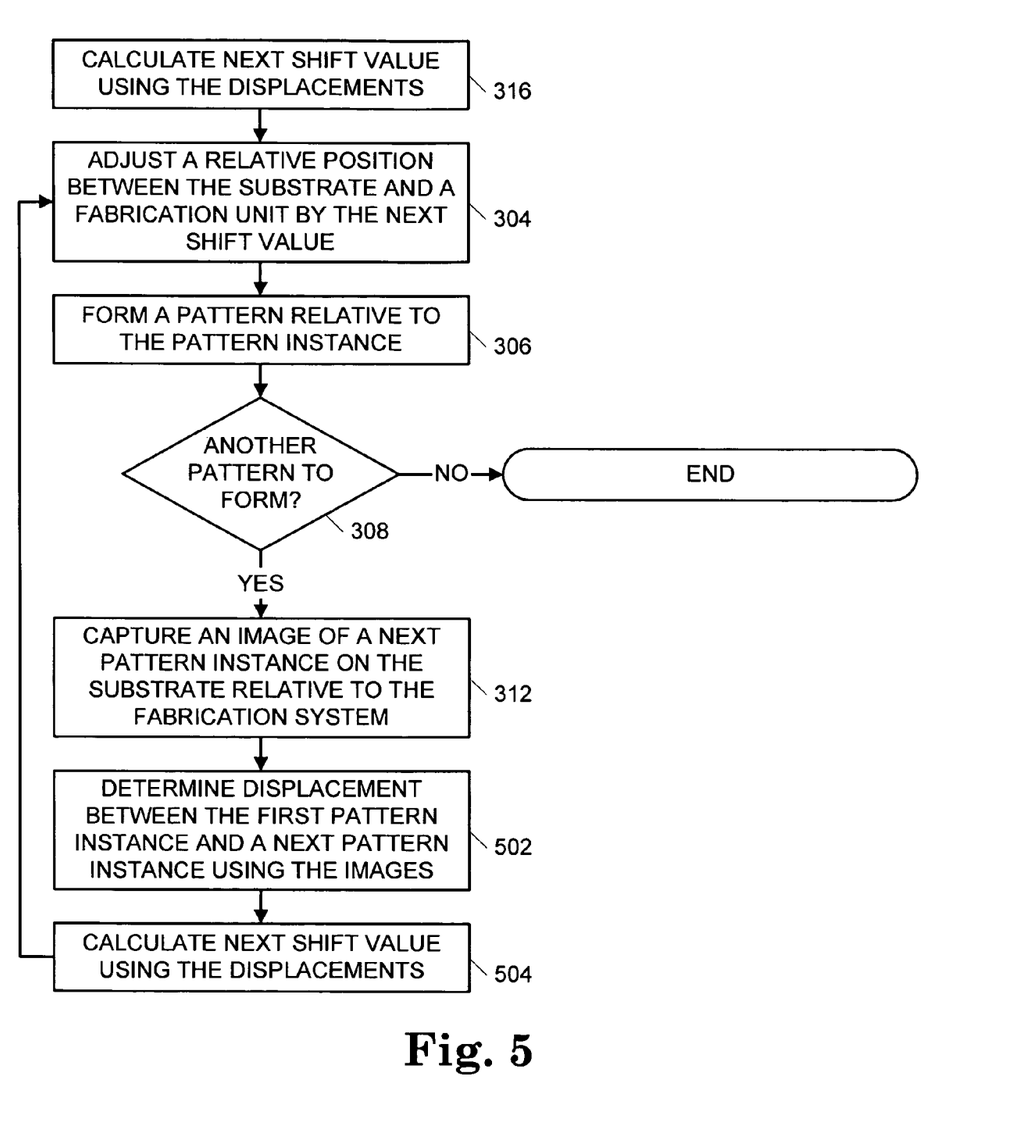
FIG. 5 is a flow chart illustrating another embodiment of a method for forming patterns on a substrate in a fabrication system.

FIG. 5 is a flow chart illustrating one embodiment of a method for forming patterns on substrate 120 in fabrication system 100 with processing system 102. The method of FIG. 5 will be described with reference to fabrication system 100 as shown in FIG. 1 and examples of pattern instances 122 and substrate 120 as shown in FIGS. 6A-6B according to one embodiment.

The method shown in FIG. 5 represents a continuation of the method shown in FIG. 3. In performing the function of block 302 in the method of FIG. 3, image 116 is stored by processing system 102. Similarly, displacement vector 408 as determined in performing the function of block 310 is stored by processing system 102. Subsequent to performing the function of block 316 for the first time in the method of FIG. 3, the functions of blocks 304, 306, 308, and 312 are repeated as described above as shown in the method of FIG. 5. In the method of FIG. 5, however, the function of block 310 is omitted as shown.

Figure 6A:
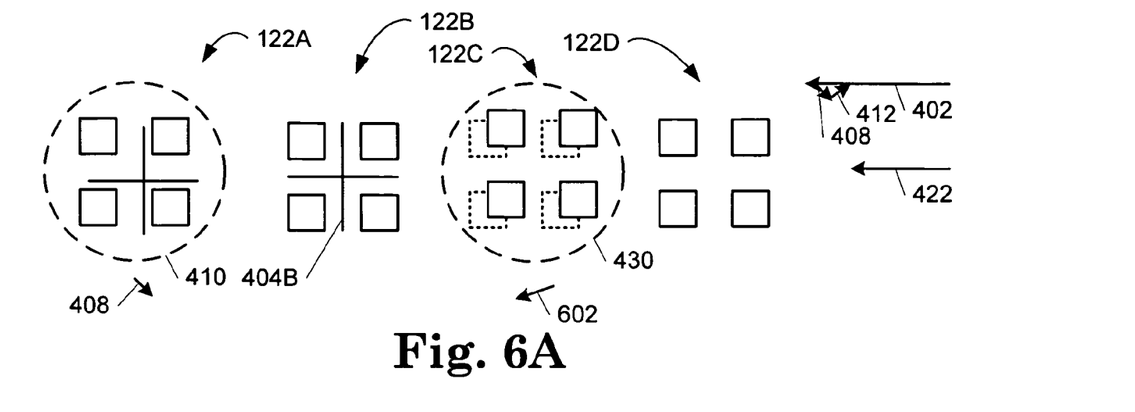
FIGS. 6A-6B are diagrams illustrating one embodiment of a method of forming patterns on a substrate.
Figure 6B:
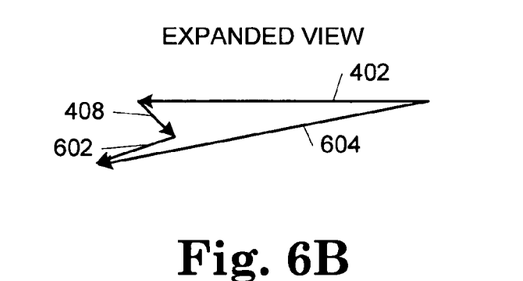

As shown in the example of FIG. 6A, an image 116 that includes region 430 with next pattern instance 122C is captured in performing the function of block 312 in the method of FIG. 5. As indicated in a block 502 of the method of FIG. 5, processing system 102 determines a displacement between the first pattern instance, e.g., pattern instance 122A, and a next pattern instance, e.g., pattern instance 122C, using images 116. In one embodiment, displacement module 114 determines a displacement vector, e.g., a displacement vector 602 as shown in FIG. 6A, using a first image 116 that includes the next pattern instance 122C and a second image 116 that includes the first pattern instance 122A where the second image 116 was captured in performing the function of block 302 in the method of FIG. 3. In FIG. 6A, the dashed lines shown in region 430 represent pattern instance 122A in the second image 116 relative to pattern instance 122C in the first image 116.

Processing system 102 calculates the next shift value using the displacement calculated in performing the function of block 502 in the method of FIG. 5, e.g., displacement vector 602, and the displacement calculated in performing the function of block 302 in the method of FIG. 3, e.g., displacement vector 408. In the embodiment of FIG. 5, displacement module 114 calculates the next shift value by adding the displacement vectors determined in blocks 302 and 502 to the nominal shift value, e.g., nominal shift vector 402. As illustrated in the example of FIG. 6B, displacement vectors 408 and 602 are added to nominal shift vector 402 to generate displacement vector 604.

The method returns to repeat the function of block 304 using the next shift value calculated in block 504. The method continues performing the functions of blocks 304, 306, 308, 312, 502, and 504 until there are no additional patterns to form on substrate 120.

In other embodiments, the function of block 310 in the method of FIG. 3 may be repeated after each N pattern instances 122 where N is greater than one. Accordingly, the function of block 310 may be selectively omitted during iterations of performing the functions of blocks 304 through 316. By doing so, fabrication system 100 may periodically detect any misalignments of formed patterns relative to pattern instances 122.

In other embodiments, images 116 captured in performing the function of block 312 in the method of FIG. 5 may be stored and used in subsequent iterations of performing the function of block 502 to calculate the average of previous displacements and at least partially compensate for subtle deviations in pattern instances 122 on substrate 120.

In other embodiments, a predictor (e.g., a Kalman filter) may be used as a dynamic error-compensator in calculating the next shift values, particularly where distortions of substrate 120 or variations of pattern instances 122 occur gradually (or otherwise with some non-random tendency) across substrate 120.

In the above embodiments, processing system 102 may measure rotation of or perform affine transformations on formed patterns or pattern instances 122 in calculating displacements.

Although regular geometric pattern instances were used in the examples of FIGS. 4A-4E and 6A-6B, any other shapes of pattern instances may be used in other embodiments including pattern instances that include structures that are inherent to the substrate being fabricated. The pattern instances may overlap and occlude each other in any way as long as it is possible to at least determine a displacement of the first formed pattern relative to the first pattern instance.

Embodiments described herein may provide advantages over previous systems. For example, substrates may be positioned and re-positioned relative to a fabrication unit without the need to overlay patterns on top of each other. In addition, center lines may not need to be calculated. Further, patterns may not need to be symmetric. Still further, systematic errors may be inherently calibrated out.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method performed by a fabrication system, the method comprising:
    adjusting a first relative position between a substrate and a fabrication unit by a first shift value;
    forming a first pattern relative to a first pattern instance on the substrate subsequent to adjusting the first relative position by the first shift value;
    calculating a second shift value using a first displacement between the first pattern and the first pattern instance and a second displacement between a second relative position of the first pattern instance with respect to the fabrication unit prior to the first relative position being adjusted by the first shift value and a third relative position of a second pattern instance on the substrate with respect to the fabrication unit subsequent to the first relative position being adjusted by the first shift value; and
    adjusting the first relative position between the substrate and the fabrication unit by the second shift value.

2. The method of claim 1 further comprising:
forming a second pattern relative to the second pattern instance on the substrate subsequent to adjusting the first relative position by the second shift value.

3. The method of claim 2 further comprising:
    calculating a third shift value using a third displacement between the second pattern and the second pattern instance and a fourth displacement between the third relative position of the second pattern instance with respect to the fabrication unit prior to the first relative position being adjusted by the second shift value and a fourth relative position of a third pattern instance on the substrate with respect to the fabrication unit subsequent to the first relative position being adjusted by the second shift value; and
    adjusting the first relative position between the substrate and the fabrication unit by the third shift value.

4. The method of claim 2 further comprising:
    calculating a third shift value using the first displacement and a third displacement between a fourth relative position of a third pattern instance on the substrate with respect to the fabrication unit subsequent to the first relative position being adjusted by the second shift value and the second relative position of the first pattern instance with respect to the fabrication unit prior to the first relative position being adjusted by the first shift value; and
    adjusting the first relative position between the substrate and the fabrication unit by the third shift value.

5. The method of claim 1 further comprising:
    adjusting the first relative position between the substrate and the fabrication unit by the first shift value by moving the substrate relative to the fabrication unit.

6. The method of claim 1 further comprising:
    adjusting the first relative position between the substrate and the fabrication unit by the first shift value by moving the fabrication unit relative to the substrate.

7. The method of claim 1 further comprising:
capturing calibration information that includes the first pattern and the first pattern instance from the substrate subsequent to adjusting the first relative position; and
determining the first displacement using the calibration information.

8. The method of claim 1 further comprising:
capturing a first image that includes the first pattern instance from the substrate prior to adjusting the first relative position by the first shift value;
capturing a second image that includes the second pattern instance from the substrate subsequent to adjusting the first relative position by the first shift value and prior to adjusting the first relative position by the second shift value; and
determining the second displacement using the first image and the second image.

9. The method of claim 8 further comprising:
capturing the first image and the second image using a data acquisition system that has a fixed position relative to the fabrication unit.

10. The method of claim 1 wherein the first shift value is a nominal shift value.

11. A system comprising:
a fabrication unit;
a processing system; and
a positioning system;
wherein the positioning system is configured to adjust a first relative position between a substrate and the fabrication unit by a first shift value, wherein the fabrication unit is configured to form a first pattern relative to a first pattern instance on the substrate subsequent to the first relative position being adjusted by the first shift value, and wherein the processing system is configured to calculate a second shift value using a first displacement between the first pattern and the first pattern instance and a second displacement between a second relative position of the first pattern instance with respect to the fabrication unit prior to the first relative position being adjusted by the first shift value and a third relative position of a second pattern instance on the substrate with respect to the fabrication unit subsequent to the first relative position being adjusted by the first shift value.

12. The system of claim 11 wherein the positioning system is configured to adjust the first relative position between the substrate and the fabrication unit by the second shift value, and wherein the fabrication unit is configured to form a second pattern relative to the second pattern instance on the substrate subsequent to the first relative position being adjusted by the second shift value.

13. The system of claim 12 wherein the processing system is configured to calculate a third shift value using a third displacement between the second pattern and the second pattern instance and a fourth displacement between the third relative position of the second pattern instance with respect to the fabrication unit prior to the first relative position being adjusted by the second shift value and a fourth relative position of a third pattern instance on the substrate with respect to the fabrication unit subsequent to the first relative position being adjusted by the second shift value, and wherein the positioning system is configured to adjust the first relative position between the substrate and the fabrication unit by the third shift value.

14. The system of claim 12 wherein the processing system is configured to calculate a third shift value using the first displacement and a third displacement between a fourth relative position of a third pattern instance on the substrate with respect to the fabrication unit subsequent to the first relative position being adjusted by the second shift value and the second relative position of the first pattern instance with respect to the fabrication unit prior to the first relative position being adjusted by the first shift value, and wherein the positioning system is configured to adjust the first relative position between the substrate and the fabrication unit by the third shift value.

15. The system of claim 11 wherein the positioning system is configured to adjust the first relative position between the substrate and the fabrication unit by the first shift value by moving the substrate relative to the fabrication unit.

16. The system of claim 11 wherein the positioning system is configured to adjust the first relative position between the substrate and the fabrication unit by the first shift value by moving the fabrication unit relative to the substrate.

17. The system of claim 11 further comprising:
a first data acquisition system configured to capture a first image that includes the first pattern instance from the substrate prior to adjusting the first relative position by the first shift value and a second image that includes the second pattern instance from the substrate subsequent to adjusting the first relative position by the first shift value and prior to adjusting the first relative position by the second shift value; and
wherein the processing system is configured to determine the second displacement using the first image and the second image.

18. The system of claim 17 further comprising:
a second data acquisition system configured to capture a calibration information that includes the first pattern and the first pattern instance from the substrate subsequent to adjusting the first relative position; and
wherein the processing system is configured to determine the first displacement using the calibration information.

19. The system of claim 17 wherein the first data acquisition system is configured to capture a third image that includes the first pattern and the first pattern instance from the substrate subsequent to adjusting the first relative position; and
wherein the processing system is configured to determine the first displacement using the third image.

20. The system of claim 17 wherein the first data acquisition system has a fixed position relative to the fabrication unit.

21. A system comprising:
means for adjusting a first relative position between a substrate and a fabrication unit by a first shift value;
means for forming a first pattern relative to a first pattern instance on the substrate subsequent to adjusting the first relative position by the first shift value; and
means for calculating a second shift value using a first displacement between the first pattern and the first pattern instance and a second displacement between a second relative position of the first pattern instance with respect to the fabrication unit prior to the first relative position being adjusted by the first shift value and a third relative position of a second pattern instance on the substrate with respect to the fabrication unit subsequent to the first relative position being adjusted by the first shift value.

22. The system of claim 21 further comprising:
means for adjusting the first relative position between the substrate and the fabrication unit by the second shift value; and
means for forming a second pattern relative to the second pattern instance on the substrate subsequent to adjusting the first relative position by the second shift value.

23. The system of claim 22 further comprising:
means for calculating a third shift value using a third displacement between the second pattern and the second pattern instance and a fourth displacement between the third relative position of the second pattern instance with respect to the fabrication unit prior to the first relative position being adjusted by the second shift value and a fourth relative position of a third pattern instance on the substrate with respect to the fabrication unit subsequent to the first relative position being adjusted by the second shift value; and
means for adjusting the first relative position between the substrate and the fabrication unit by the third shift value.

24. The system of claim 22 further comprising:
means for calculating a third shift value using the first displacement and a third displacement between a fourth relative position of a third pattern instance on the substrate with respect to the fabrication unit subsequent to the first relative position being adjusted by the second shift value and the second relative position of the first pattern instance with respect to the fabrication unit prior to the first relative position being adjusted by the first shift value; and
means for adjusting the first relative position between the substrate and the fabrication unit by the third shift value.

25. The system of claim 21 further comprising:
means for capturing a calibration information that includes the first pattern and the first pattern instance from the substrate subsequent to adjusting the first relative position; and
means for determining the first displacement using the calibration information.

26. The system of claim 21 further comprising:
means for capturing a first image that includes the first pattern instance from the substrate prior to adjusting the first relative position by the first shift value;
means for capturing a second image that includes the second pattern instance from the substrate subsequent to adjusting the first relative position by the first shift value and prior to adjusting the first relative position by the second shift value; and
means for determining the second displacement using the first image and the second image.

27. The system of claim 21 wherein the first shift value is a nominal shift value.

28. A computer-readable medium having instructions for causing a processing system to perform a method comprising:
determining a first displacement between a first pattern formed by a fabrication unit on a substrate relative to a first pattern instance on the substrate subsequent to a first relative position between the substrate and the fabrication unit being adjusted by a first shift value by a positioning system;
determining a second displacement between a second relative position of the first pattern instance with respect to the fabrication unit prior to the first relative position being adjusted by the first shift value and a third relative position of a second pattern instance on the substrate with respect to the fabrication unit subsequent to the first relative position between the substrate and the fabrication unit being adjusted by the first shift value;
calculating a second shift value using the first displacement, the second displacement, and the first shift value; and
providing the second shift value to the positioning system to cause the first relative position between the substrate and the fabrication unit to be adjusted by the second shift value.

29. The computer-readable medium of claim 28 having instructions causing the processing system to perform the method comprising:
determining a third displacement between a second pattern formed by the fabrication unit on the substrate relative to the second pattern instance on the substrate subsequent to the first relative position between the substrate and the fabrication unit being adjusted by the second shift value by the positioning system;
determining a fourth displacement between the third relative position of the second pattern instance with respect to the fabrication unit prior to the first relative position being adjusted by the second shift value and a fourth relative position of a third pattern instance on the substrate with respect to the fabrication unit subsequent to the first relative position between the substrate and the fabrication unit being adjusted by the second shift value by the positioning system; and
calculating a third shift value using the third displacement, the fourth displacement, and the second shift value.

30. The computer-readable medium of claim 28 having instructions causing the processing system to perform the method comprising:
determining a third displacement between the second relative position of the first pattern instance with respect to the fabrication unit prior to the first relative position between the substrate and the fabrication unit being adjusted by the first shift value and a fourth relative position of a third pattern instance on the substrate subsequent to the first relative position between the substrate and the fabrication unit being adjusted by the second shift value by the positioning system; and
calculating a third shift value using the first displacement, the third displacement, and the first shift value.

* * * * *